(12) United States Patent
Kim et al.

(10) Patent No.: US 11,910,662 B2
(45) Date of Patent: Feb. 20, 2024

(54) DISPLAY DEVICE USING A SIMULTANEOUS LIGHT EMITTING METHOD AND DRIVING METHOD THEREOF

(71) Applicant: SAMSUNG DISPLAY CO., LTD., Yongin-si (KR)

(72) Inventors: Hong Soo Kim, Yongin-si (KR); Bon Seog Gu, Yongin-si (KR); Woo Mi Bae, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 208 days.

(21) Appl. No.: 16/886,860

(22) Filed: May 29, 2020

(65) Prior Publication Data
US 2020/0395432 A1 Dec. 17, 2020

(30) Foreign Application Priority Data
Jun. 12, 2019 (KR) .................. 10-2019-0069615

(51) Int. Cl.
*H10K 59/131* (2023.01)
*G09G 3/3275* (2016.01)
*G09G 3/3266* (2016.01)
*H10K 59/121* (2023.01)

(52) U.S. Cl.
CPC ......... *H10K 59/131* (2023.02); *G09G 3/3266* (2013.01); *G09G 3/3275* (2013.01); *H10K 59/1213* (2023.02); *H10K 59/1216* (2023.02)

(58) Field of Classification Search
CPC ...... G09G 3/3208; G09G 3/32; G09G 3/3266; G09G 3/3275; G09G 2310/0251; G09G 2320/0233; G09G 2300/0819; G09G 2320/0686; G09G 2330/028; H01L 27/3262; H01L 27/3265; H01L 27/3276
See application file for complete search history.

(56) References Cited

U.S. PATENT DOCUMENTS

| 2006/0028408 A1* | 2/2006 | Kim | G09G 3/3233 345/76 |
| 2006/0221007 A1* | 10/2006 | Kim | G09G 3/3225 345/76 |
| 2009/0033610 A1* | 2/2009 | Cho | G09G 3/3413 345/101 |
| 2009/0322730 A1* | 12/2009 | Yamamoto | G09G 3/3266 345/213 |

(Continued)

FOREIGN PATENT DOCUMENTS

KR 10-2018-0091985 8/2018

*Primary Examiner* — Shaheda A Abdin
(74) *Attorney, Agent, or Firm* — F. CHAU & ASSOCIATES, LLC

(57) ABSTRACT

A display device includes a first pixel coupled to a first scan line and a data line, and including a first light emitting diode having a cathode coupled to a first power line, and a second pixel coupled to a second scan line and the data line, and including a second light emitting diode having a cathode coupled to a second power line. The first scan line and the second scan line are different from each other. The first power line and the second power line are different from each other. Emission start times and emission end times of the first pixel and the second pixel are synchronized.

20 Claims, 11 Drawing Sheets

(56) References Cited

U.S. PATENT DOCUMENTS

| | | | |
|---|---|---|---|
| 2011/0279484 A1* | 11/2011 | Han | G09G 3/3233 345/77 |
| 2012/0105605 A1* | 5/2012 | Nam | G09G 3/003 348/51 |
| 2016/0012776 A1* | 1/2016 | Kong | G09G 3/3208 345/77 |
| 2016/0189609 A1* | 6/2016 | Seo | G09G 3/3233 345/78 |
| 2018/0158409 A1* | 6/2018 | Byun | G09G 3/3233 |
| 2018/0226023 A1 | 8/2018 | Park et al. | |

* cited by examiner

DISPLAY DEVICE USING A SIMULTANEOUS LIGHT EMITTING METHOD AND DRIVING METHOD THEREOF

CROSS-REFERENCE TO RELATED APPLICATION

The present application claims priority under 35 U.S.C. § 119(a) to Korean Patent Application No. 10-2019-0069615, filed on Jun. 12, 2019 in the Korean Intellectual Property Office, the disclosure of which is incorporated by reference herein in its entirety.

TECHNICAL FIELD

Exemplary embodiments of the inventive concept relate to a display device using a simultaneous light emitting method and a driving method thereof.

DISCUSSION OF RELATED ART

With the development of information technologies, the importance of a display device as a connection medium between a user and information increases. Accordingly, display devices such as liquid crystal display devices, organic light emitting display devices, and plasma display devices are increasingly used.

A display device may include a plurality of pixels. A case where all pixels of the display device simultaneously emit light with respect to one image frame may be referred to as a simultaneous light emitting method. In addition, a case where the pixels of the display device sequentially emit light in units of horizontal lines with respect to one image frame may be referred to as a sequential light emitting method.

When the display device employs the simultaneous light emitting method, a period in which a pixel should maintain a data voltage written thereto is different for each horizontal line, and therefore, a luminance deviation between display areas may occur.

SUMMARY

According to an exemplary embodiment of the inventive concept, a display device includes a first pixel coupled to a first scan line and a data line, and including a first light emitting diode having a cathode coupled to a first power line, and a second pixel coupled to a second scan line and the data line, and including a second light emitting diode having a cathode coupled to a second power line. The first scan line and the second scan line are different from each other, the first power line and the second power line are different from each other, and emission start times and emission end times of the first pixel and the second pixel are synchronized.

Each of the first pixel and the second pixel may further include a first transistor including a gate electrode coupled to a first node, a first electrode coupled to a third power line, and a second electrode coupled to a second node. The third power line may be commonly coupled to the first pixel and the second pixel.

Each of the first pixel and the second pixel may further include a second transistor including a first electrode coupled to the first node and a second electrode coupled to a third node. A gate electrode of the second transistor of the first pixel may be coupled to the first scan line, and a gate electrode of the second transistor of the second pixel may be coupled to the second scan line.

Each of the first pixel and the second pixel may further include a third transistor including a gate electrode coupled to a control line, a first electrode coupled to the third node, and a second electrode coupled to the second node. The control line may be commonly coupled to the first pixel and the second pixel.

Each of the first pixel and the second pixel may further include a first capacitor including a first electrode coupled to the first node and a second electrode coupled to an initialization line. The initialization line may be commonly coupled to the first pixel and the second pixel.

Each of the first pixel and the second pixel may further include a second capacitor including a first electrode coupled to the third node and a second electrode coupled to the data line.

In a data write period, a time at which a scan signal having a turn-on level is supplied to the first scan line may be earlier than that at which a scan signal having the turn-on level is supplied to the second scan line. In a period between the emission start times and the emission end times, a voltage applied to the first power line may be greater than that applied to the second power line.

Each of the first pixel and the second pixel may further include a first transistor including a gate electrode coupled to a first node, a first electrode, and a second electrode coupled to a second node. The first electrode of the first transistor of the first pixel may be coupled to a third power line, and the first electrode of the first transistor of the second pixel may be coupled to a fourth power line. The third power line and the fourth power line may be different from each other.

In a data write period, at a time at which a scan signal having the turn-on level is supplied to the first scan line may be earlier than that at which a scan signal having the turn-on level is supplied to the second scan line. In a period between the emission start times and the emission end times, a voltage applied to the first power line may be greater than that applied to the second power line, and a voltage applied to the third power line may be smaller than that applied to the fourth power line.

According to an exemplary embodiment of the inventive concept, a display device includes a first pixel coupled to a first scan line and a data line, and a second pixel coupled to a second scan line and the data line. The first scan line and the second scan line are different from each other. Each of the first pixel and the second pixel includes a first transistor including a gate electrode coupled to a first node, a first electrode, and a second electrode coupled to a second node. The first electrode of the first transistor of the pixel is coupled to a first power line, and the first electrode of the first transistor of the second pixel is coupled to a second power line. The first power line and the second power line are different from each other. Emission start times and emission end times of the first pixel and the second pixel are synchronized.

Each of the first pixel and the second pixel may further include a light emitting diode including an anode coupled to the second node and a cathode coupled to a third power line. The third power line may be commonly coupled to the first pixel and the second pixel.

Each of the first pixel and the second pixel may further include a second transistor including a first electrode coupled to the first node and a second electrode coupled to a third node. A gate electrode of the second transistor of the first pixel may be coupled to the first scan line, and a gate electrode of the second transistor of the second pixel may be coupled to the second scan line.

Each of the first pixel and the second pixel may further include a third transistor including a gate electrode coupled to a control line, a first electrode coupled to the third node, and a second electrode coupled to the second node. The control line may be commonly coupled to the first pixel and the second pixel.

Each of the first pixel and the second pixel may further include a first capacitor including a first electrode coupled to the first node and a second electrode coupled to an initialization line. The initialization line may be commonly coupled to the first pixel and the second pixel.

Each of the first pixel and the second pixel may further include a second capacitor including a first electrode coupled to the third node and a second electrode coupled to the data line.

In a data write period, a time at which a scan signal having a turn-on level is supplied to the first scan line may be earlier than that at which a scan signal having the turn-on level is supplied to the second scan line. In a period between the emission start times and the emission end times, a voltage applied to the first power line may be smaller than that applied to the second power line.

According to an exemplary embodiment of the inventive concept, in a method for driving a display device, the display device includes a first pixel coupled to a first scan line and a data line, and including a first light emitting diode having a cathode coupled to a first power line, and a second pixel coupled to a second scan line and the data line, and including a second light emitting diode having a cathode coupled to a second power line. The method includes decreasing voltages of the first power line and the second power line at substantially the same time; and increasing voltages of the first power line and the second power line at substantially the same time. In the decreasing, a voltage applied to the first power line is greater than that applied to the second power line.

In the increasing, the voltage applied to the first power line and the voltage applied to the second power line may be equal to each other.

In a data write period, a time at which a scan signal having a turn-on level is supplied to the first scan line may be earlier than that at which a scan signal having the turn-on level is supplied to the second scan line.

In an initialization period, a time at which a scan signal having the turn-on level is supplied to the first scan line may be substantially equal to that at which a scan signal having the turn-on level is supplied to the second scan line.

BRIEF DESCRIPTION OF THE DRAWINGS

The above and other features of the inventive concept will be better understood by describing in detail exemplary embodiments thereof with reference to the accompanying drawings.

DETAILED DESCRIPTION OF THE EMBODIMENTS

Figure 1:
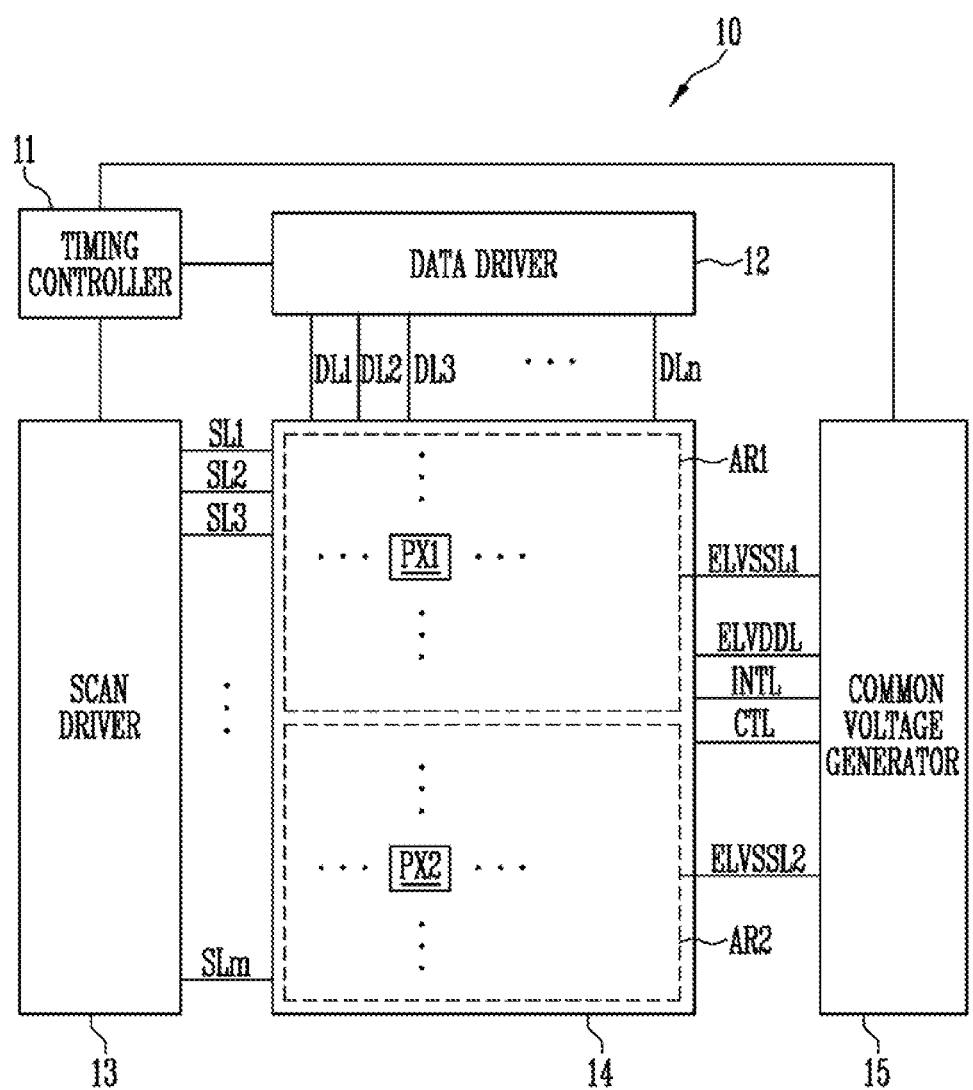
FIG. 1 is a diagram illustrating a display device according to an exemplary embodiment of the inventive concept.

Exemplary embodiments of the inventive concept provide a display device capable of preventing a luminance deviation between display areas in the display device using a simultaneous light emitting method, and a driving method of the display device.

Exemplary embodiments of the inventive concept will be described more fully hereinafter with reference to the accompanying drawings. Like reference numerals may refer to like elements throughout this application.

In the drawings, dimensions may be exaggerated for clarity of illustration. It will be understood that when an element is referred to as being "between" two elements, it can be the only element between the two elements, or one or more intervening elements may also be present.

FIG. 1 is a diagram illustrating a display device according to an exemplary embodiment of the inventive concept.

Referring to FIG. 1, a display device 10 in accordance with an exemplary embodiment of the inventive concept may include a timing controller 11, a data driver 12, a scan driver 13, a pixel unit 14, and a common voltage generator 15.

The timing controller 11 may receive grayscale values and control signals with respect to respective image frames from an external processor. The timing controller 11 may render the grayscale values to correspond to specifications of the display device 10. For example, the external processor may provide a red grayscale value, a green grayscale value, and a blue grayscale value with respect to respective unit dots.

However, for example, when the pixel unit 14 has a Pentile structure, adjacent unit dots share a pixel, and therefore, pixels may not correspond one-to-one to the respective grayscale values. Accordingly, it is necessary to render the grayscale values. When the pixels correspond one-to-one to the respective grayscale values, it may be unnecessary to render the grayscale values. Grayscale values that are rendered or are not rendered may be provided to the data driver 12. Additionally, the timing controller 11 may provide the data driver 12, the scan driver 13, the common voltage generator 15, and the like with control signals suitable for their specifications so as to display image frames.

The data driver 12 may generate data voltages to be provided to data lines DL1, DL2, DL3, . . . , and DLn by using grayscale values and control signals, which are received from the timing controller 11. For example, the data driver 12 may sample the grayscale values by using a clock signal, and apply, in units of pixel rows, data voltages corresponding to the grayscale values to the data lines DL1, DL2, DL3, . . . , and DLn. Here, n may be an integer greater than 0.

The scan driver 13 may generate scan signals to be provided to scan lines SL1, SL2, SL3, . . . , and SLm by receiving control signals including a clock signal, a scan start signal, and the like from the timing controller 11. Here, m may be an integer greater than 0. The scan driver 13 may provide scan signals through the scan lines SL1, SL2, SL3, . . . , and SLm, to select pixels to which data voltages are to be written. For example, the scan driver 13 may sequentially provide scan signals having a turn-on level to the scan lines SL1 to SLm, to select a pixel row to which data voltages are to be written. Each stage circuit of the scan driver 13 may be configured in a shift register form. The scan driver 13 may generate scan signals in a manner that sequentially transfers the scan start signal to a next scan stage under the control of the clock signal.

The pixel unit 14 may include a first area AR1 and a second area AR2. The first area AR1 may include first pixels PX1. The second area AR2 may include second pixels PX2. The first pixels PX1 may be coupled to first scan lines. The second pixels PX2 may be coupled to second scan lines different from the first scan lines. The first pixels PX1 and the second pixels PX2 may be coupled to the same data lines. Emission start times and emission end times of the first pixels PX1 and the second pixels PX2 may be synchronized (e.g., equal to each other). In other words, emission periods of the first pixels PX1 and the second pixels PX2 may be equal to each other.

The first scan lines may include a first scan line SL1. The second scan lines may include a last scan line SLm. In other words, in a data write period, a time at which a scan signal having the turn-on level is supplied to the first scan lines may be earlier than that at which a scan signal having the turn-on level is supplied to the second scan lines.

A case where the pixel unit 14 includes only two areas AR1 and AR2 is illustrated in FIG. 1. However, in another example, the pixel unit 14 may include three or more areas. For example, the pixel unit 14 may include a third area between the first area AR1 and the second area AR2. In the data write period, the time at which a scan signal having the turn-on level is supplied to the first scan lines may be earlier than that at which a scan signal having the turn-on level is supplied to third scan lines of the third area. Additionally, in the data write period, the time at which a scan signal having the turn-on level is supplied to the third scan lines may be earlier than that at which a scan signal having the turn-on level is supplied to the second scan lines.

Each pixel may be coupled to a corresponding data line and a corresponding scan line. For example, when data voltages are applied to the data lines DL1 to DLn from the data driver 12, the data voltages may be written to a pixel row located at a scan line that receives a scan signal having the turn-on level from the scan driver 13.

The common voltage generator 15 may generate common voltages commonly applied to the pixels of the pixel unit 14.

For example, the common voltage generator 15 may generate a third power voltage, an initialization voltage, and a control voltage, which are commonly supplied to the first area AR1 and the second area AR2. The third power voltage may be applied to a third power line ELVDDL. The initialization voltage may be applied to an initialization line INTL. The control voltage may be applied to a control line CTL.

For example, the common voltage generator 15 may generate a first power voltage supplied to the first area AR1. The first power voltage may be applied to a first power line ELVSSL1. The first power line ELVSSL1 may be coupled to a cathode of a first light emitting diode of each of the first pixels PX1.

For example, the common voltage generator 15 may generate a second power voltage supplied to the second area AR2. The second power voltage may be applied to a second power line ELVSSL2. The second power line ELVSSL2 may be coupled to a cathode of a second light emitting diode of each of the second pixels PX2. The first power line ELVSSL1 and the second power line ELVSSL2 may be different from each other.

The common voltage generator 15 may be implemented in various forms. In an example, the common voltage generator 15 may be integrated with a portion or the whole of the data driver 12. In another example, the common voltage generator 15 may be integrated with a portion or the whole of the timing controller 11. In still another example, the common voltage generator 15 may be integrated with a portion or the whole of the timing controller 11 and the data driver 12. Additionally, the common voltage generator 15 may be implemented as a separate integrated circuit (IC).

Figure 2:
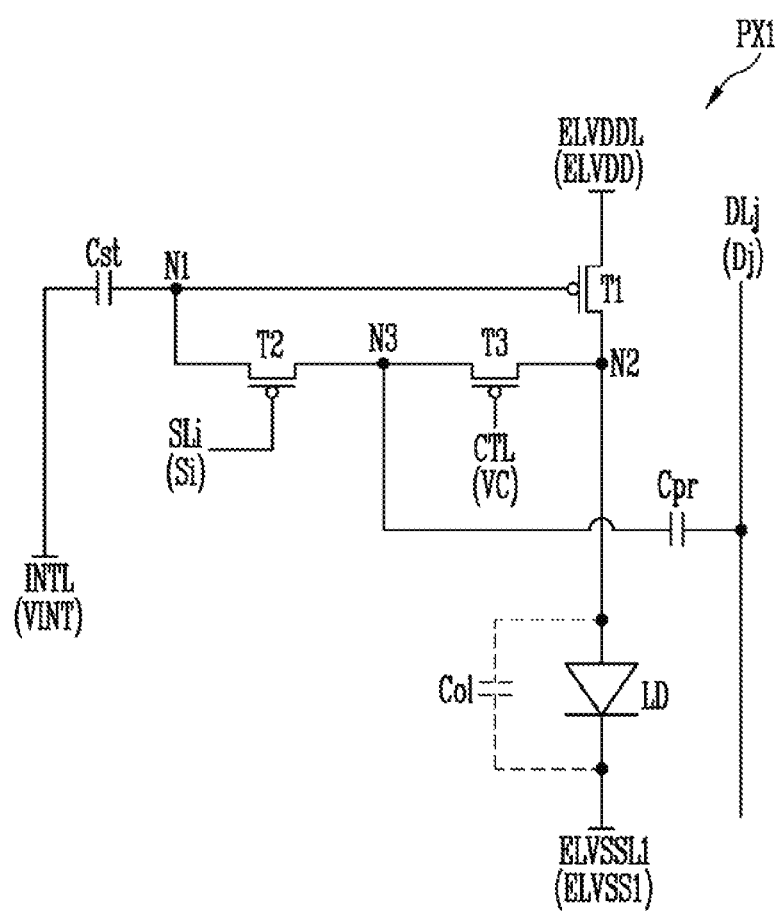
FIG. 2 is a diagram illustrating a first pixel according to an exemplary embodiment of the inventive concept.

FIG. 2 is a diagram illustrating a first pixel according to an exemplary embodiment of the inventive concept.

A case where the first pixel PX1 is a pixel coupled to an ith scan line SLi and a jth data line DLj is described. Here, i and j are integers greater than 0.

Referring to FIG. 2, the first pixel PX1 in accordance with the exemplary embodiment of the inventive concept may include first to third transistors T1, T2, and T3, first and second capacitors Cst and Cpr, and a light emitting diode LD.

In the present exemplary embodiment, each of the transistors T1, T2, and T3 is illustrated as a P-type transistor. Therefore, when a voltage applied to a gate electrode of the transistor has a low level, the low level may be referred to as a turn-on level. When the voltage applied to the gate electrode of the transistor has a high level, the high level may be referred to as a turn-off level.

However, the inventive concept is not limited thereto. For example, at least some of the transistors T1, T2, and T3 may be implemented as N-type transistors.

A gate electrode of the first transistor T1 may be coupled to a first node N1, a first electrode of the first transistor T1 may be coupled to the third power line ELVDDL, and a second electrode of the first transistor T1 may be coupled to a second node N2. The first transistor T1 may be referred to as a driving transistor.

A gate electrode of the second transistor T2 may be coupled to the ith scan line SLi, a first electrode of the second transistor T2 may be coupled to the first node N1, and a second electrode of the second transistor T2 may be coupled to a third node N3. The second transistor T2 may be referred to as a scan transistor.

A gate electrode of the third transistor T3 may be coupled to the control line CTL, a first electrode of the third transistor T3 may be coupled to the third node N3, and a second electrode of the third transistor T3 may be coupled to the second node N2. The third transistor T3 may be referred to as an initialization transistor.

A first electrode of the first capacitor Cst may be coupled to the first node N1, and a second electrode of the first capacitor Cst may be coupled to the initialization line INTL. The first capacitor Cst may be referred to as a storage capacitor.

A first electrode of the second capacitor Cpr may be coupled to the third node N3, and a second electrode of the second capacitor Cpr may be coupled to the jth data line DLj.

An anode of the light emitting diode LD may be coupled to the second node N2, and a cathode of the light emitting diode LD may be coupled to the first power line ELVSSL1.

The light emitting diode LD may be configured as an organic light emitting diode, an inorganic light emitting diode, a quantum dot light emitting diode, or the like.

The light emitting diode LD emits light only when the difference between voltages of its anode and its cathode becomes a certain level or more. However, the anode and the cathode of the light emitting diode LD act as a kind of capacitor, and therefore, the voltage of the anode is not immediately changed. Accordingly, a capacitor Col of the light emitting diode LD is illustrated so as to describe in detail an emission time of the light emitting diode LD.

A third power voltage ELVDD may be applied to the third power line ELVDDL, a first power voltage ELVSS1 may be applied to the first power line ELVSSL1, an initialization voltage VINT may be applied to the initialization line INTL, a control voltage VC may be applied to the control line CTL, a scan signal Si may be applied to the ith scan line SLi, and a data voltage Dj may be applied to the jth data line DLj.

A driving current path may include the third power line ELVDDL, the first electrode and the second electrode of the first transistor T1, the anode and the cathode of the light emitting diode LD, and the first power voltage line ELVSSL1. When a driving current having a certain level or more flows along the driving current path, the capacitor Col of the light emitting diode LD is charged, so that the light emitting diode LD can emit light.

Figure 3:
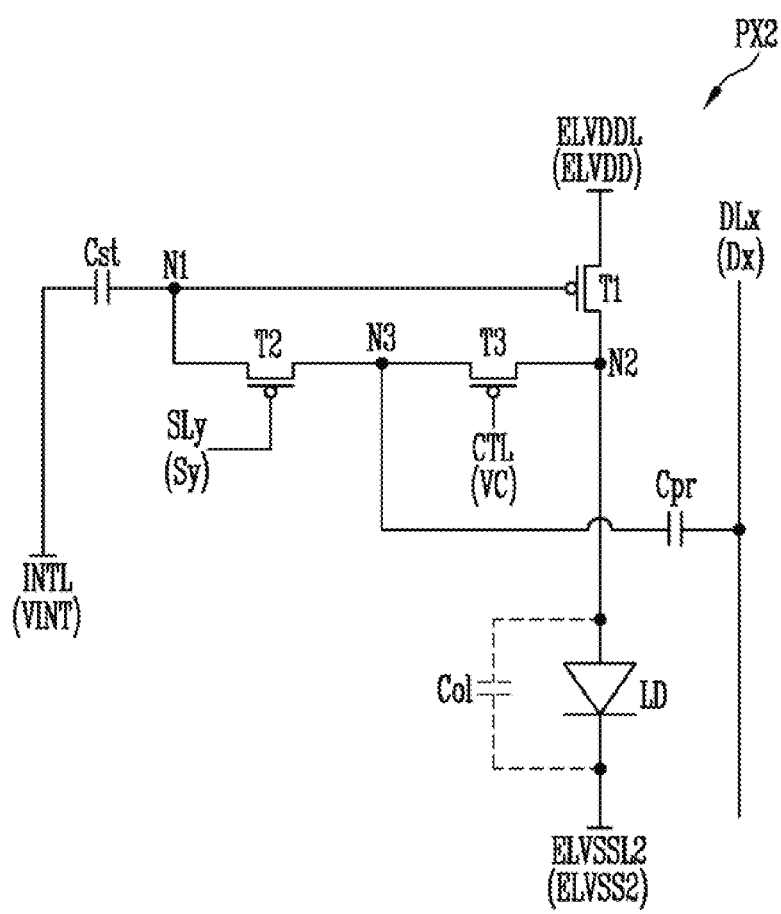
FIG. 3 is a diagram illustrating a second pixel according to an exemplary embodiment of the inventive concept.

FIG. 3 is a diagram illustrating a second pixel according to an exemplary embodiment of the inventive concept.

A second pixel PX2 may be different from the first pixel PX1, in that the gate electrode of the second transistor T2 is coupled to a yth scan line SLy and the second electrode of the second capacitor Cpr is coupled to an xth data line DLx.

The xth data line DLx may be identical to or different from the jth data line DLj. The yth scan line SLy is different from the ith scan line SLi. Here, x may be an integer greater than 0, and y may be an integer greater than i.

A scan signal Sy may be applied to the yth scan line SLy. A data voltage Dx may be applied to the xth data line DLx. A second power voltage ELVSS2 may be applied to a second power line ELVSSL2.

FIGS. 4 to 7 are diagrams illustrating a driving method of a pixel according to an exemplary embodiment of the inventive concept.

Figure 4:
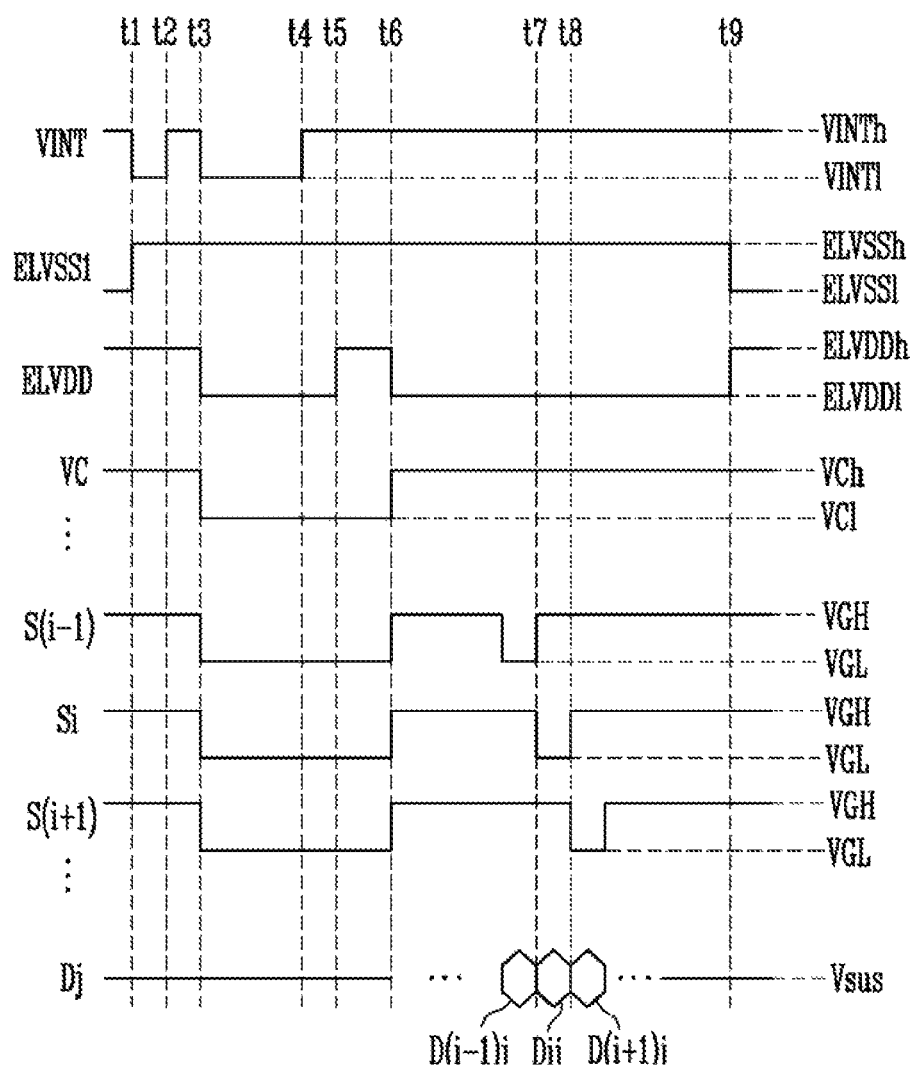
FIGS. 4 to 7 are diagrams illustrating a driving method of a pixel according to an exemplary embodiment of the inventive concept.

The first pixel PX1 and the second pixel PX2 have the same driving method in periods corresponding to FIGS. 4 to 6, and therefore, only the first pixel PX1 will be described. A differentiated driving method of the first pixel PX1 and the second pixel PX2 will be described in a period corresponding to FIG. 7.

At a time t1, the first power voltage ELVSS1 may increase from a low level ELVSS1 to a high level ELVSSh, and the initialization voltage VINT may decrease from a high level VINTh to a low level VINT1. The third power voltage ELVDD may maintain a high level ELVDDh. For example, the high level ELVDDh of the third power voltage ELVDD and the high level ELVSSh of the first power voltage ELVSS1 may be equal to each other.

Since the difference between voltages of the anode and the cathode of the light emitting diode LD is not sufficient, emission of the light emitting diode LD according to a grayscale of a previous image frame is ended. In addition, since the voltage of the first node N1 decreases due to coupling caused by the first capacitor Cst, an on-biased voltage is applied to the first transistor T1. Accordingly, a hysteresis issue of the first transistor T1 can be reduced. In other words, the first transistor T1 may have a consistent current to gate-source voltage characteristic, regardless of a data voltage of the previous image frame. The period from the time t1 to a time t2 may be referred to as an on-biased period.

At a time t3, the initialization voltage VINT may decrease from the high level VINTh to the low level VINT1, the third power voltage ELVDD may decrease from the high level ELVDDh to a low level ELVDD1, the control voltage VC may decrease from a high level VCh to a low level VC1, and the voltage level of each of scan signals S(i−1), Si, and S(i+1) may decrease from a high level VGH to a low level VGL.

Accordingly, the second transistor T2 and the third transistor T3 are turned on, and voltages of the first to third nodes N1, N2, and N3 are initialized. Since a reverse biased voltage is applied to the light emitting diode LD, the light emitting diode LD does not emit light. A period from the time t1 to a time t4 may be referred to as an initialization period.

At a time t5, the third power voltage ELVDD may increase from the low level ELVDD1 to the high level ELVDDh.

Figure 5:
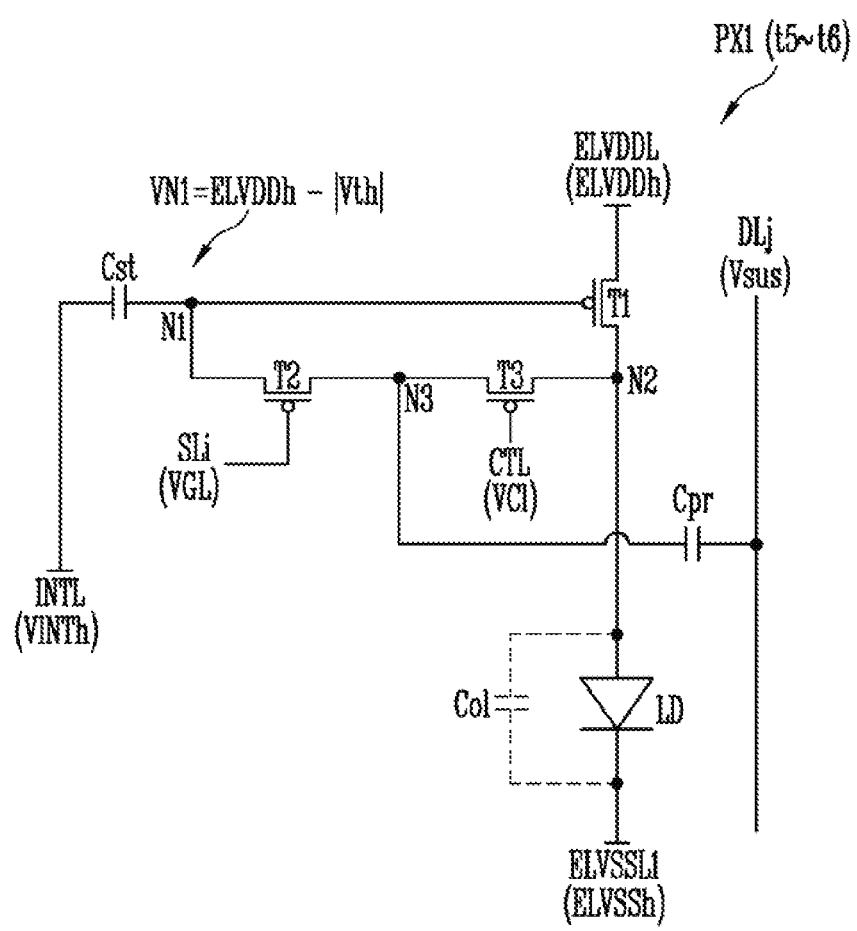
Figure 6:
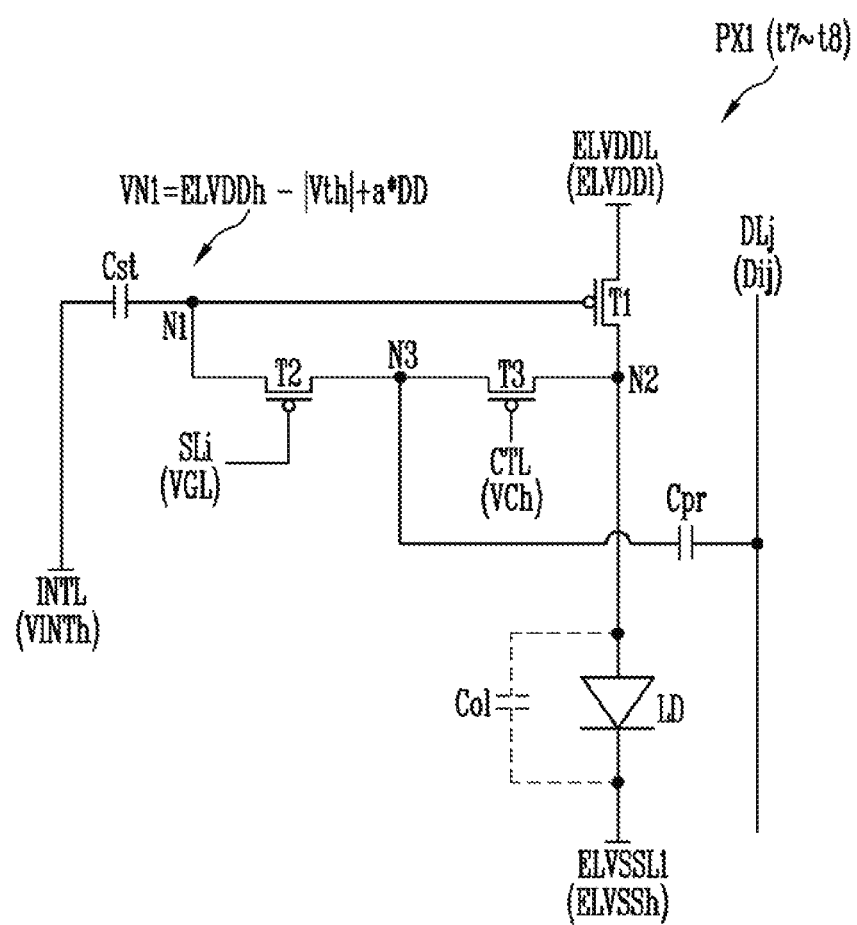

Referring to FIG. 5, the first to third nodes N1, N2, and N3 may be coupled to one another through the second transistor T2 and the third transistor T3, which are turned on. Therefore, the first transistor T1 is diode-coupled. Since the first transistor T1 is in a state in which it is diode-coupled, a voltage VN1 obtained by subtracting a threshold voltage |Vth| of the first transistor T1 from the third power voltage ELVDD having the high level ELVDDh may be applied to the first node N1. A period from the time t5 to a time t6 may be referred to as a threshold voltage compensation period.

A period from the time t6 to a time t9 may be referred to as a data write period.

In the data write period, the scan driver 13 may sequentially apply the scan signals S(i−1), Si, and S(i+1) having the turn-on level VGL to the scan lines. For example, the scan driver 13 may apply the scan signals S(i−1), Si, and S(i+1) having the turn-on level VGL to each of the scan lines in one horizontal period unit.

In addition, the data driver 12 may be synchronized with the scan driver 13, to sequentially apply data voltages D(i−1)j, Dij, and D(i+1)j to the data line DLj.

For convenience of description, a period (t7 to t8) in which the data voltage Dij and the scan signal Si having the turn-on level VGL are applied to the first pixel PX1 will be described (see FIG. 6).

As compared with the period (t5 to t6), the voltage of the data line DLj in the period (t7 to t8) is changed from a reference voltage Vsus to the data voltage Dij. Since the second transistor T2 is in a turn-on state and the third transistor T3 is in a turn-off state, the first capacitor Cst and the second capacitor Cpr are in a state in which they are coupled in series between the data line DLj and the initialization line INTL.

Therefore, as compared with the period (t5 to t6) shown in FIG. 5, the first node voltage VN1 may further reflect a difference voltage DD between the data voltage Dij and the reference voltage Vsus, based on a capacitance ratio a of the first capacitor Cst and the second capacitor Cpr (see the following Equations 1 to 3).

$$DD = Dij - Vsus \qquad \text{Equation 1}$$

$$a = CprF/(CstF + CprF) \qquad \text{Equation 2}$$

$$VN1 = ELVDDh - |Vth| + a*DD \qquad \text{Equation 3}$$

CstF is a capacitance of the first capacitor Cst, and CprF is a capacitance of the second capacitor Cpr.

Referring back to FIG. 4, at a time t9, the third power voltage ELVDD may be changed from the low level ELVDD1 to the high level ELVDDh, and the first power voltage ELVSS1 may be changed from the high level ELVSSh to the low level ELVSS1. Therefore, a voltage in a forward direction may be applied to the light emitting diode LD, so that the driving current path is activated. An amount of driving current flowing through the first transistor T1 may be determined based on the voltage stored in the first node N1. The light emitting diode LD may emit light with a luminance corresponding to the amount of driving current.

The time t9 may be an emission start time. A time t1 of a next image frame may be an emission end time. In other words, a period from the time t9 of the current image frame to the time t1 of the next image frame may be referred to as an emission period of the pixel unit 14 with respect to the current image frame.

Figure 7:
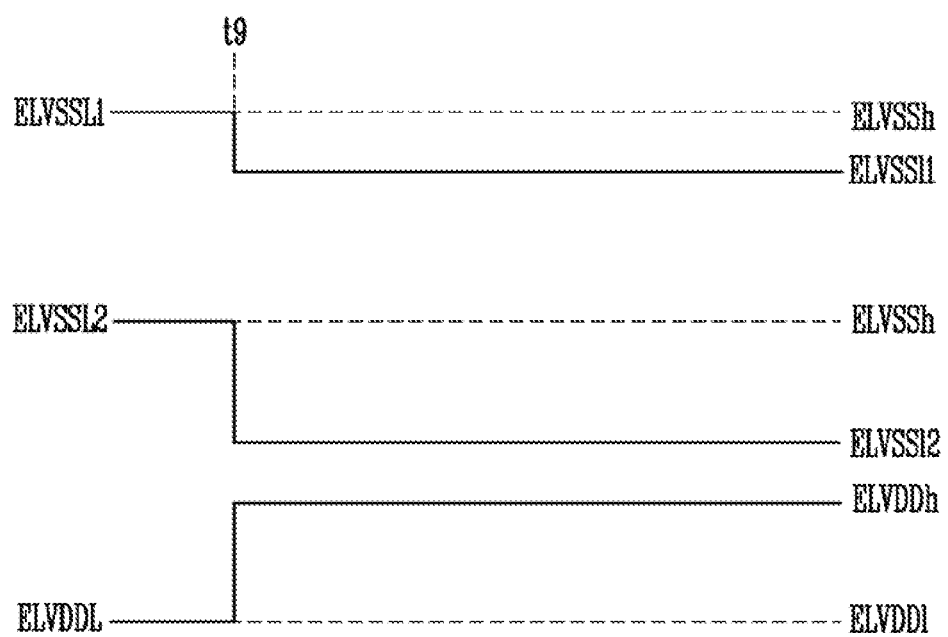

Referring to FIG. 7, after the time t9, a voltage ELVSS11 applied to the first power line ELVSSL1 coupled to the first pixel PX1 and a voltage ELVSS12 applied to the second power line ELVSSL2 coupled to the second pixel PX2 are illustrated.

In the period between the emission start time t9 and the emission end time t1, the voltage ELVSS11 applied to the first power line ELVSSL1 may be greater than the voltage ELVSS12 applied to the second power line ELVSSL2.

A time at which a data voltage is written to the first node N1 of the first pixel PX1 as shown in FIG. 5 is earlier than that at which a data voltage is written to the first node N1 of the second pixel PX2. In addition, since emission start times t9 of the pixels PX1 and PX2 are synchronized (e.g., equal to each other), a leakage current is generated from the first node in the first pixel PX1 for a longer time than that in the second pixel PX2. Hence, although the same data voltage is written to the first pixel PX1 and the second pixel PX2, the first node voltage VN1 of the first pixel PX1 at the emission start time t9 is smaller than the first node voltage VN1 of the second pixel PX2. Therefore, the first light emitting diode emits light with a luminance higher than that of the second light emitting diode of the second pixel PX2, and accordingly, a luminance deviation between areas occurs.

Thus, in accordance with the exemplary embodiment shown in FIG. 7, a difference between the level ELVDDh of the third power voltage ELVDD and the level ELVSS11 of the first power voltage ELVSS1 in the first pixel PX1 is smaller than that between the level ELVDDh of the third power voltage ELVDD and the level ELVSS12 of the second power voltage ELVSS2 in the second pixel PX2, so that the luminance of the first light emitting diode of the first pixel PX1 can be lowered. Accordingly, the luminance deviation between the first area AR1 and the second area AR2 can be decreased.

Figure 8:
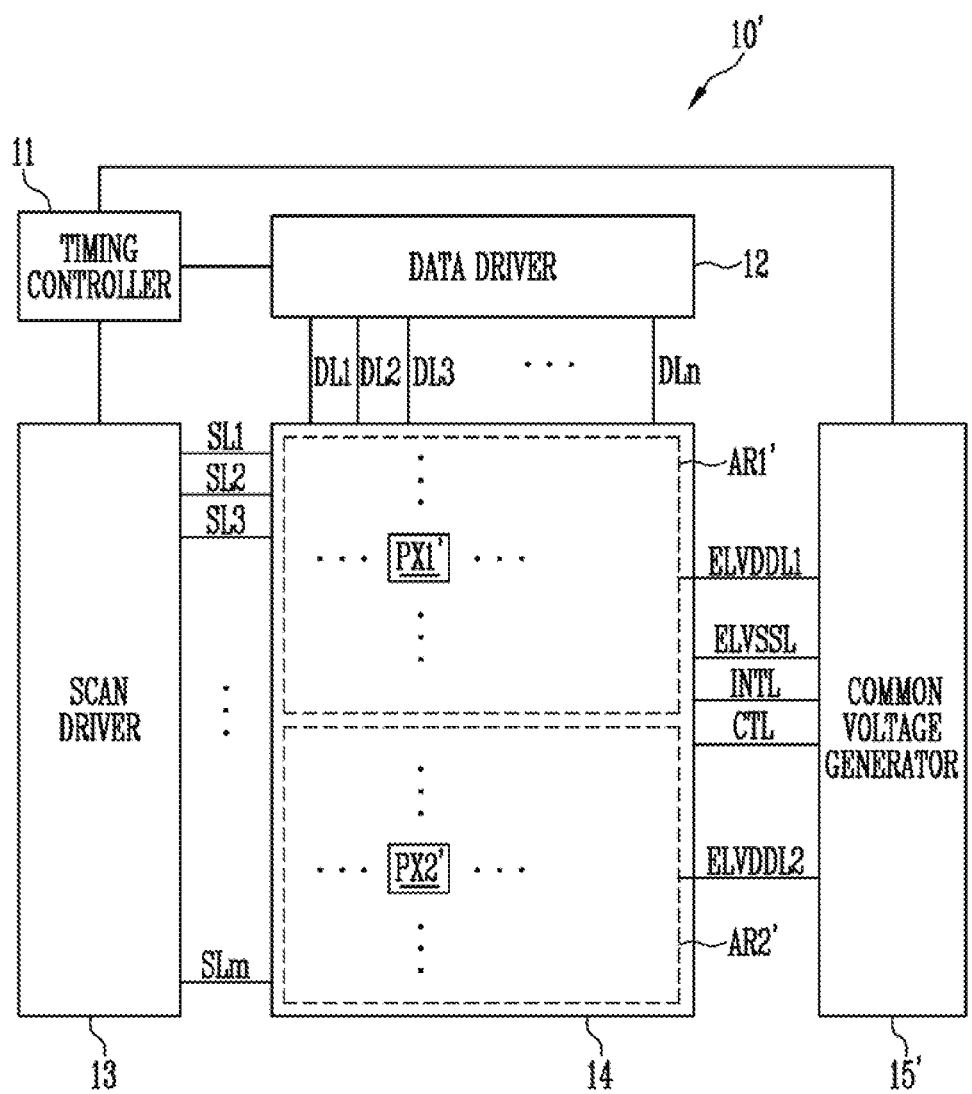
FIGS. 8 and 9 are diagrams illustrating a display device and a driving method thereof according to an exemplary embodiment of the inventive concept.
Figure 9:
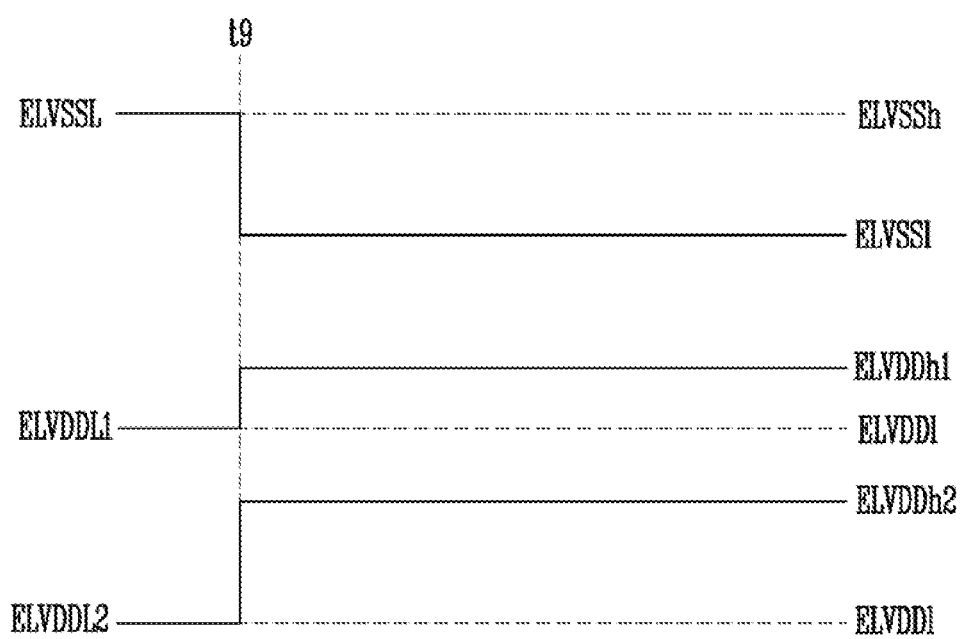

FIGS. 8 and 9 are diagrams illustrating a display device and a driving method thereof according to an exemplary embodiment of the inventive concept.

Components of a display device 10 shown in FIG. 8, which overlap with those of the display device 10 shown in FIG. 1 will not be described again.

Each of a first pixel PX1' of a first region AR1' and a second pixel PX2' of a second region AR2' may include the first transistor T1 that includes a gate electrode coupled to the first node N1, a first electrode, and a second electrode coupled to the second node N2 (see FIG. 2).

In the present exemplary embodiment, the first electrode of the first transistor T1 of the first pixel PX1' may be coupled to the first power line ELVDDL1. In addition, the first electrode of the first transistor T1 of the second pixel PX2' may be coupled to the second power line ELVDDL2. The first power line ELVDDL1 and the second power line ELVDDL2 may be different from each other.

Each of the first pixel PX1' and the second pixel PX2' may further include a light emitting diode that includes an anode coupled to the second node N2 and a cathode coupled to a third power line ELVSSL. The third power line ELVSSL may be commonly coupled to the first pixel PX1' and the second pixel PX2'.

A common voltage generator 15' may apply a first power voltage to a first power line ELVDDL1, apply a second power voltage to a second power line ELVDDL2, apply a third power voltage to the third power line ELVSSL, apply an initialization voltage to the initialization line INTL, and apply a control voltage to the control line CTL.

As described above, in the data write period, a time at which a scan signal having the turn-on level is supplied to the first scan lines may be earlier than that at which a scan signal having the turn-on level is supplied to the second scan lines.

In the period between the emission start time t9 and the emission end time t1, a voltage ELVDDh1 applied to the first power line ELVDDL1 may be smaller than a voltage ELVDDh2 applied to the second power line ELVDDL2.

Thus, in accordance with the exemplary embodiment shown in FIG. 9, a difference between the level ELVDDh1 of the first power voltage and the level ELVSS1 of the third power voltage in the first pixel PX1' is smaller than that between the level ELVDDh2 of the second power voltage and the level ELVSS1 of the third power voltage in the second pixel PX2', so that the luminance of the light emitting diode of the first pixel PX1' can be lowered. Accordingly, the luminance deviation between the first region AR1' and the second region AR2' can be decreased.

Figure 10:
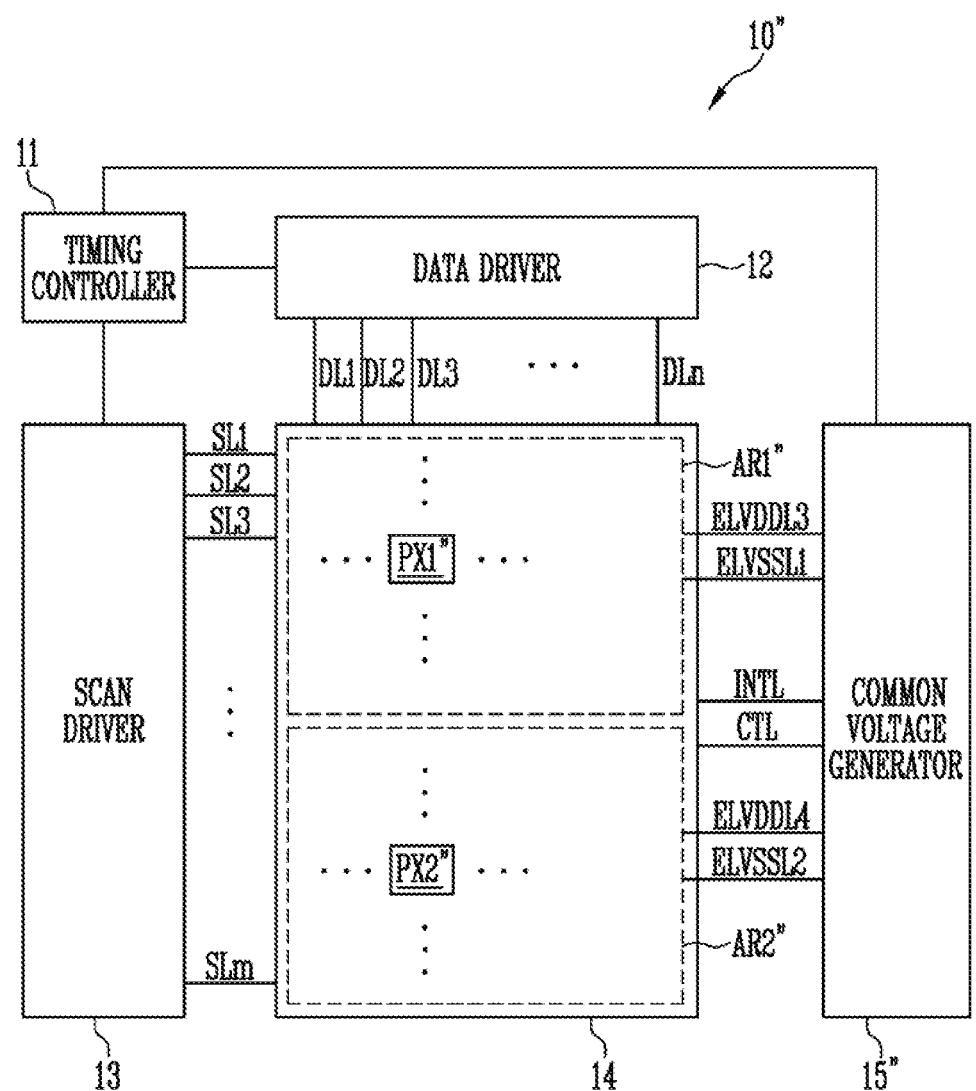
FIGS. 10 and 11 are diagrams illustrating a display device and a driving method thereof according to an exemplary embodiment of the inventive concept.
Figure 11:
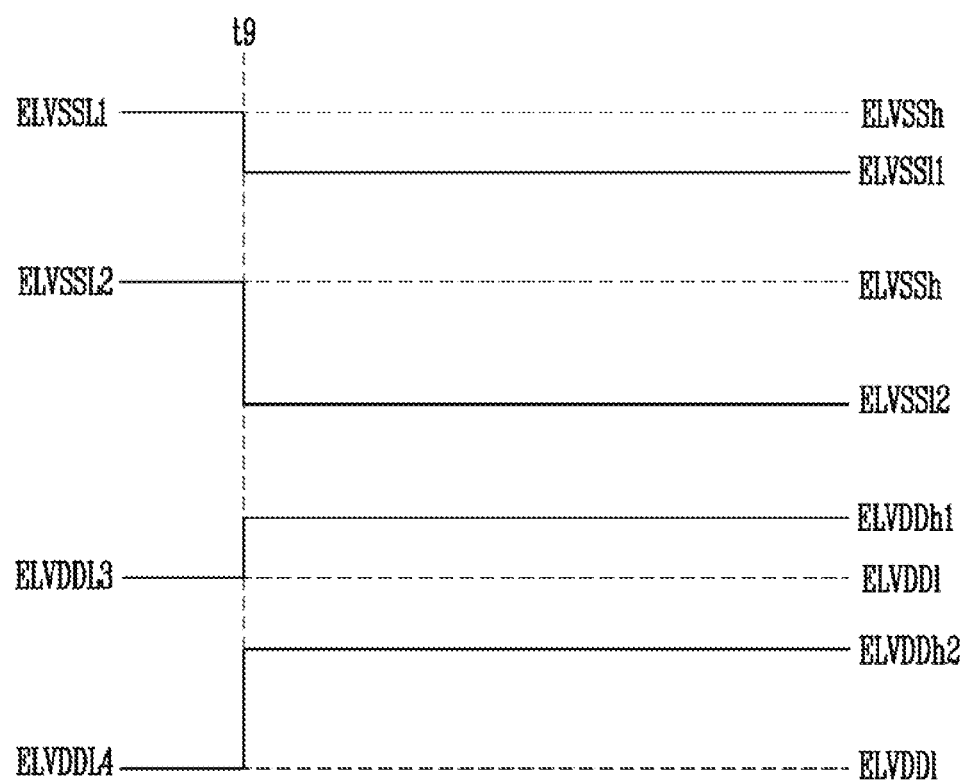

FIGS. 10 and 11 are diagrams illustrating a display device and a driving method thereof according to an exemplary embodiment of the inventive concept.

Components of a display device 10" shown in FIG. 10, which overlap with those of the display device 10 shown in FIG. 1 will not be described again.

In a first pixel PX1", the cathode of the first light emitting diode may be coupled to the first power line ELVSSL1, and the first electrode of the first transistor T1 may be coupled to a third power line ELVDDL3.

In a second pixel PX2", the cathode of the second light emitting diode may be coupled to the second power line ELVSSL2, and the first electrode of the first transistor T1 may be coupled to a fourth power line ELVDDL4.

The first power line ELVSSL1 and the second power line ELVSSL2 may be different from each other. In addition, the third power line ELVDDL3 and the fourth power line ELVDDL4 may be different from each other.

As described above, in the data write period, a time at which a scan signal having the turn-on level is supplied to the first scan lines may be earlier than that at which a scan signal having the turn-on level is supplied to the second scan lines.

In the period between the emission start time t9 and the emission end time t1, a voltage ELVSS11 applied to the first power line ELVSSL1 may be greater than a voltage ELVSS12 applied to the second power line ELVSSL2, and a voltage ELVDDh1 applied to the third power line ELVDDL3 may be smaller than a voltage ELVDDh2 applied to the fourth power line ELVDDL4.

Thus, in accordance with the exemplary embodiment shown in FIG. 11, a luminance of the first light emitting diode of the first pixel PX1" is lower than that of the second light emitting diode of the second pixel PX2" with respect to the same voltage, so that the luminance deviation between a first region AR1" and a second region AR2" can be decreased.

As described above, in the display device and the driving method thereof in accordance with exemplary embodiments of the inventive concept, a luminance deviation between display areas can be prevented in the display device using a simultaneous light emitting method.

While the inventive concept has been shown and described with reference to exemplary embodiments thereof, it will be understood by those of ordinary skill in the art that various changes in form and details may be made thereto without departing from the spirit and scope of the inventive concept as set forth by the following claims.

What is claimed is:

1. A display device comprising:
a first area including first pixels coupled to first scan lines and data lines, each of the first pixels coupled to a corresponding first scan line among the first scan lines and a corresponding data line among the data lines, and including a first light emitting diode having a cathode directly coupled to a first power line; and
a second area including second pixels coupled to second scan lines and the data lines, each of the second pixels being coupled to a corresponding second scan line among the second scan lines and the corresponding data line among the data lines, and including a second light emitting diode having a cathode directly coupled to a second power line,
wherein the first scan lines and the second scan lines are different from each other so that the first area and the second area are not overlapped,
wherein the first power line and the second power line are different from each other,
wherein emission start times and emission end times of the first pixels and the second pixels are synchronized, and
wherein voltage levels of the first power line and the second power line are different from each other in a period between the emission start times and the emission end times.

2. The display device of claim 1, wherein each of the first pixels and the second pixels further includes a first transistor including a gate electrode coupled to a first node, a first electrode coupled to a third power line, and a second electrode coupled to a second node, and
wherein the third power line is commonly coupled to the first pixels and the second pixels.

3. The display device of claim 2, wherein each of the first pixels and the second pixels further includes a second transistor including a first electrode coupled to the first node and a second electrode coupled to a third node,
wherein a gate electrode of the second transistor of each of the first pixels is coupled to the corresponding first scan line, and
wherein a gate electrode of the second transistor of each of the second pixels is coupled to the corresponding second scan line.

4. The display device of claim 3, wherein each of the first pixels and the second pixels further includes a third transistor including a gate electrode coupled to a control line, a first electrode coupled to the third node, and a second electrode coupled to the second node, and
wherein the control line is commonly coupled to the first pixels and the second pixels.

5. The display device of claim 4, wherein each of the first pixels and the second pixels further includes a first capacitor including a first electrode coupled to the first node and a second electrode coupled to an initialization line, and
wherein the initialization line is commonly coupled to the first pixels and the second pixels.

6. The display device of claim 5, wherein each of the first pixels and the second pixels further includes a second capacitor including a first electrode coupled to the third node and a second electrode coupled to the corresponding data line.

7. The display device of claim 6, wherein, in a data write period, a time at which a scan signal having a turn-on level is supplied to the corresponding first scan line is earlier than that at which a scan signal having the turn-on level is supplied to the corresponding second scan line, and
wherein, in the period between the emission start times and the emission end times, a voltage applied to the first power line is greater than that applied to the second power line.

8. The display device of claim 1, wherein each of the first pixels and the second pixels further includes a first transistor including a gate electrode coupled to a first node, a first electrode, and a second electrode coupled to a second node,
wherein the first electrode of the first transistor of each of the first pixels is coupled to a third power line,
wherein the first electrode of the first transistor of each of the second pixels is coupled to a fourth power line, and
wherein the third power line and the fourth power line are different from each other.

9. The display device of claim 8, wherein, in a data write period, at a time at which a scan signal having a turn-on level is supplied to the corresponding first scan line is earlier than that at which a scan signal having the turn-on level is supplied to the corresponding second scan line, and
wherein, in the period between the emission start times and the emission end times, a voltage applied to the first power line is greater than that applied to the second power line, and a voltage applied to the third power line is smaller than that applied to the fourth power line.

10. A display device comprising:
a first area including first pixels coupled to first scan lines and data lines, each of the first pixels coupled to a corresponding first scan line among the first scan lines and a corresponding data line among the data lines; and
a second area including second pixels coupled to second scan lines and the data lines, each of the second pixels being coupled to a corresponding second scan line among the second scan lines and a corresponding data line among the data lines,
wherein the first scan lines and the second scan lines are different from each other so that the first area and the second area are not overlapped,
wherein each of the first pixels and the second pixels includes a first transistor including a gate electrode coupled to a first node, a first electrode, and a second electrode directly coupled to a second node,
wherein the first electrode of the first transistor of each of the first pixels is directly coupled to a first power line,
wherein the first electrode of the first transistor of each of the second pixels is directly coupled to a second power line,
wherein the first power line and the second power line are different from each other,
wherein emission start times and emission end times of the first pixels and the second pixels are synchronized,
wherein voltage levels of the first power line and the second power line are different from each other in a period between the emission start times and the emission end times, and
wherein each of the first pixels and the second pixels further includes a light emitting diode including an anode directly coupled to the second node and a cathode coupled to a third power line.

11. The display device of claim 10, wherein the third power line is commonly coupled to the first pixels and the second pixels.

12. The display device of claim 11, wherein each of the first pixels and the second pixels further includes a second transistor including a first electrode coupled to the first node and a second electrode coupled to a third node,
wherein a gate electrode of the second transistor of each of the first pixels is coupled to the corresponding first scan line, and
wherein a gate electrode of the second transistor of each of the second pixels is coupled to the corresponding second scan line.

13. The display device of claim 12, wherein each of the first pixels and the second pixels further includes a third transistor including a gate electrode coupled to a control line, a first electrode coupled to the third node, and a second electrode coupled to the second node, and
wherein the control line is commonly coupled to the first pixels and the second pixels.

14. The display device of claim 13, wherein each of the first pixels and the second pixels further includes a first capacitor including a first electrode coupled to the first node and a second electrode coupled to an initialization line, and
wherein the initialization line is commonly coupled to the first pixels and the second pixels.

15. The display device of claim 14, wherein each of the first pixels and the second pixels further includes a second capacitor including a first electrode coupled to the third node and a second electrode coupled to the corresponding data line.

16. The display device of claim 15, wherein, in a data write period, a time at which a scan signal having a turn-on level is supplied to the corresponding first scan line is earlier than that at which a scan signal having the turn-on level is supplied to the corresponding second scan line, and
wherein, in the period between the emission start times and the emission end times, a voltage applied to the first power line is smaller than that applied to the second power line.

17. A method for driving a display device,
wherein the display device includes:
a first area including first pixels coupled to first scan lines and data lines, each of the first pixels being coupled to a corresponding first scan line among the first scan lines and a corresponding data line among the data lines, and including a first light emitting diode having a cathode coupled to a first power line; and
a second area including second pixels coupled to second scan lines and the data lines, each of the second pixels being coupled to a corresponding second scan line among the second scan lines and the corresponding data line among the data lines, and including a second light emitting diode having a cathode coupled to a second power line,
wherein the first scan lines and the second scan lines are different from each other so that the first area and the second area are not overlapped,
wherein the method comprises:
decreasing voltages of the first power line and the second power line at substantially the same time; and
increasing the voltages of the first power line and the second power line at substantially the same time, and
wherein, in the decreasing, a voltage applied to the first power line is greater than that applied to the second power line.

18. The method of claim 17, wherein, in the increasing, the voltage applied to the first power line and the voltage applied to the second power line are equal to each other.

19. The method of claim 17, wherein, in a data write period, a time at which a scan signal having a turn-on level is supplied to the corresponding first scan line is earlier than that at which a scan signal having the turn-on level is supplied to the corresponding second scan line.

20. The method of claim 19, wherein, in an initialization period, a time at which a scan signal having the turn-on level is supplied to the corresponding first scan line is substantially equal to that at which a scan signal having the turn-on level is supplied to the corresponding second scan line.

* * * * *